April 29, 1969 H. WEINSTEIN 3,441,811

SEMICONDUCTOR WAFER HAVING LOW FIELD JUNCTION SURFACE

Filed July 11, 1966

INVENTOR.
HAROLD WEINSTEIN
BY
Ostrolenk, Faber, Gerb & Soffen
ATTORNEYS

United States Patent Office 3,441,811

Patented Apr. 29, 1969

3,441,811

SEMICONDUCTOR WAFER HAVING LOW FIELD JUNCTION SURFACE

Harold Weinstein, Van Nuys, Calif., assignor to International Rectifier Corporation, El Segundo, Calif., a corporation of California Filed July 11, 1966, Ser. No. 564,355
Int. Cl. H01l 9/00
U.S. Cl. 317—234 1 Claim

ABSTRACT OF THE DISCLOSURE

A semiconductor wafer having a bevelled edge with a junction terminating on the large area surface of the bevelled wafer and extending beneath the bevelled sides and small area surface. The termination of the junction on the large area surface is at an angle to decrease the field gradient across the junction.

This invention relates to semiconductor devices, and more specifically relates to a novel process and structure for semiconductor devices wherein at least one junction contained in a wafer terminates on a wafer surface which has been precontoured to decrease the electric field across the surface, thereby to improve the voltage characteristics of the device.

It is well known to contour the surface of a semiconductor wafer at the point where the junction within the wafer reaches the surface in order to decrease the electric field across the junction at the surface. This will then increase the voltage capability of the device.

In the past, the wafer has been prepared in the normal manner and after the junction is formed therein the wafer is later operated upon to contour the periphery thereof.

In accordance with the present invention, the geometry of the wafer prior to the formation of the junction is such that when the junction is placed in the wafer and the wafer surfaces are lapped, the surface of the wafer will automatically have such a contour with relation to the junction that the desired characteristics of the low field distribution across the surface are automatically obtained.

More particularly, and in accordance with the invention, at least one surface of the wafer which is to receive the junction is initially contoured to have a bevel edge or other contour. Thereafter, a diffusion operation is carried out over the wafer periphery to diffuse a junction extending around the wafer to some predetermined depth. The smaller flat wafer surface is then lapped, or otherwise suitably polished, to a depth below the depth of the junction in the flat surface, whereupon the junction extending under the polished surface will terminate on the polished flat surface. However, because of the bevelled shape, the junction reaches the flat surface at an angle so that the junction reaching the surface will automatically have the desired low field stress characteristics with respect to the flat surface.

Accordingly, the primary object of this invention is to increase the voltage capabilities of a semiconductor device.

Yet another object of this invention is to simplify the manufacturing process of a semiconductor device by contouring the surface of a wafer before diffusing a junction therein.

Yet another object of this invention is to provide a novel semiconductor device shape which automatically provides a decreased field gradient along the surface upon which the junction terminates.

These and other objects of this invention will become apparent from the following description when taken in connection with the drawings, in which.

Figure 1:
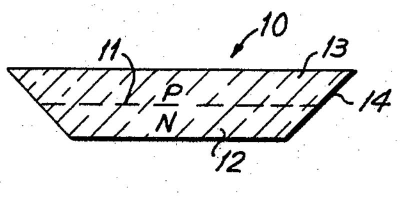
FIG. 1 (PRIOR ART)
FIGURE 1 is a cross-sectional view of a typical prior art device having a contoured or bevelled periphery to decrease the electric field gradient across the junction at the point where it terminates on the wafer surface, this contouring being done after the diffusion process.

Referring first to FIGURE 1, I have illustrated therein in cross-section a wafer 10 of any desired semiconductor material such as silicon which has a junction 11 extending thereacross existing between an N-type region 12 and a P-type region 13. The junction 11 terminates on the periphery of the wafer 10, and the periphery has been shaped to have the wedge-shaped side 14 after the diffusion process which forms junction 11.

By causing the side 14 to join the junction 11 at an angle, the effect of the distribution of immobile charges (donor and acceptor) at and near the surface will produce an increase in the space charge layer width at the surface, whereby the electric field gradient across the periphery 14 of the wafer is decreased, thereby to increase the reverse voltage capabilities of the wafer insofar as voltage breakdown across the edge of the wafer is concerned.

FIGURES 2 through 7 illustrate the manner in which the desired reduction of the electric field gradient can be achieved in accordance with the present invention.

Figure 2:
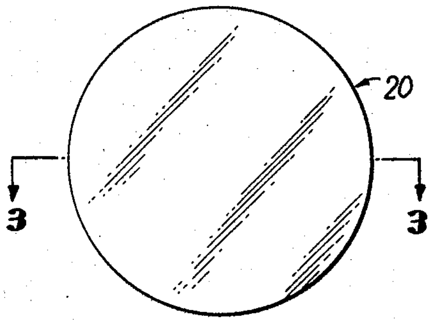
FIGURE 2 is a top view of a typical wafer which serves as a starting wafer for the process and article of the present invention.
Figure 3:
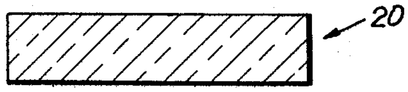
FIGURE 3 is a cross-sectional view of FIGURE 2 taken across the line 3—3 in FIGURE 2.

Referring first to FIGURES 2 and 3, there is illustrated a wafer 20 which may be of silicon, for example, which could have a diameter of 1 inch and a thickness of .025 inch, and may have an N-type conductivity. Clearly, any other suitably dimensioned device of silicon, or any of the other semiconductor materials which could be of the P-type as well as of the N-type, could also have been selected.

Figure 4:
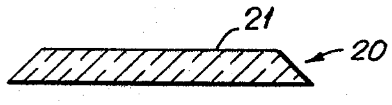
FIGURE 4 illustrates the initial contouring operation performed on the wafer of FIGURE 3 prior to a dffusion operation.

The wafer of FIGURES 2 and 3 then has its upper surface 21 contoured to have at least an approximately bevelled shaped, as shown in FIGURE 4, by means of a suitable ultrasonic cutting or grinding operation, or in any other desired manner.

Note, however, that the contour of surface 21 of FIGURE 4 could also be curved or multiangled as well as an angled bevel described herein. For purposes of the present application, the term "bevelled edge" is intended to refer to either a single, composite-angled, or a curved edge for wafer surface 20.

The wafer of FIGURE 4 is then suitably cleaned and etched, if necessary, and is thereafter placed in a suitable diffusion furnace so that a junction 30 is diffused into all surfaces (and bevelled edges) of wafer 20. Note that because of the bevel angle of the end regions 23 and 24 of the wafer 20 in FIGURE 5 the P-type diffusing material will extend at an angle in this region relative to the diffusion in the centrally located portions of the wafer.

Figure 5:
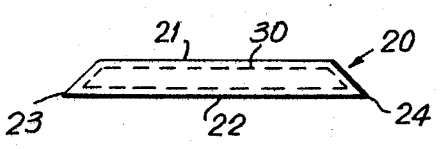
FIGURE 5 is similar to FIGURE 4 and illustrates the junction formed therein after a diffusion cycle.

While FIGURE 5 illustrates the entire wafer surface as being diffused, it should be understood that the bottom surface 22 could have been masked so that the diffusion extends only into the surface 21 and the bevelled edges.

Figure 6:
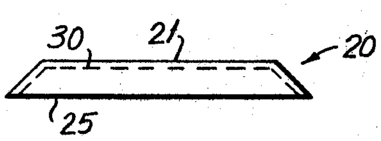
FIGURE 6 illustrates the wafer of FIGURE 5 after the junction at the flat bottom surface of the wafer has been removed, and particularly illustrates the manner in which the junction terminates on the flat bottom surface to provide the desired low field gradient across the bottom surface.

After the diffusion cycle of FIGURE 5, the bottom surface 22 is lapped or otherwise suitably polished to above the depth of the lower leg of junction 30 extending parallel to surface 22 to form the device shown in FIGURE 6 where the flat surface 25 is of the N-type conductivity. Thereafter, suitable electrodes 31 and 32 which are connectable to terminals 33 and 34, respectively, are connected to the upper surface 21 and flat bottom surface 25, respectively.

Figure 7:
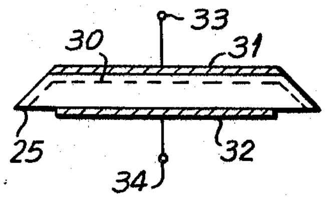
FIGURE 7 illustrates the wafer of FIGURE 6 after the application of electrodes thereto.

In accordance with the invention, the device as illustrated in FIGURES 6 and 7 will have the junction 30 terminating on the flat surface 25 at an angle to the surface 25.

This arrangement will reduce the electric field gradient existing across the junction surface 25 in FIGURE 6 and 7, thereby to increase the capability of the device for supporting a reverse voltage difference between electrodes 31 and 32.

Although this invention has been described with respect to its preferred embodiments, it should be understood that many variations and modifications will now be obvious to those skilled in the art, and it is preferred, therefore, that the scope of the invention be limted not by the specific disclosure herein, but only by the appended claim.

The embodiments of the invention in which an exclusive privilege or property is claimed are defined as follows:

1. A semiconductor device comprising a wafer of semiconductor material; said wafer having a flat bottom surface, and upper surface and a peripheral bevelled edge joining said upper and bottom surfaces; a P-N junction in said wafer; sad P-N junction extending coextensively with and beneath said upper surface and said peripheral bevelled edge and terminating on said bottom surface; and first electrode means connected to said upper surface and second electrode means connected to said flat bottom surface; said second electrode confined within the boundaries of said junction terminating on said bttom surface; said bottom surface having an area greater than the area of said upper surface.

References Cited

UNITED STATES PATENTS 2,960,640 11/1960 Emeis -------------- 317—235

JOHN W. HUCKERT, *Primary Examiner.*

J. R. SHEWMAKER, *Assistant Examiner.*